United States Patent
Kotsubo et al.

(10) Patent No.: US 7,560,135 B2
(45) Date of Patent: Jul. 14, 2009

(54) ELECTROMAGNETIC-WAVE SHIELDING AND LIGHT TRANSMITTING PLATE AND MANUFACTURING METHOD THEREOF

(75) Inventors: Hidefumi Kotsubo, Kodaira (JP); Yasuhiro Morimura, Kodaira (JP); Itsuo Tanuma, Sayama (JP)

(73) Assignee: Bridgestone Corporation, Tokyo (JP)

(*) Notice: Subject to any disclaimer, the term of this patent is extended or adjusted under 35 U.S.C. 154(b) by 579 days.

(21) Appl. No.: 10/848,361

(22) Filed: May 19, 2004

(65) Prior Publication Data
US 2004/0214502 A1    Oct. 28, 2004

Related U.S. Application Data

(63) Continuation of application No. PCT/JP02/11544, filed on Nov. 6, 2002.

(30) Foreign Application Priority Data
Nov. 20, 2001    (JP)    ............... 2001-354895

(51) Int. Cl.
*B05D 5/12*    (2006.01)
(52) U.S. Cl. .............. 427/96.3; 427/98.4; 427/282
(58) Field of Classification Search ............. 427/96.3, 427/98.4, 282
See application file for complete search history.

(56) References Cited

U.S. PATENT DOCUMENTS

| | | | | |
|---|---|---|---|---|
| 4,008,383 A | * | 2/1977 | Tanaka et al. | ............ 219/740 |
| 4,009,033 A | * | 2/1977 | Bakos et al. | ............ 430/191 |
| 4,692,809 A | * | 9/1987 | Beining et al. | ............ 348/712 |
| 5,824,361 A | * | 10/1998 | Asanuma | ............ 427/127 |
| 2001/0012869 A1 | * | 8/2001 | Fukushima et al. | ......... 524/588 |

FOREIGN PATENT DOCUMENTS

| | | |
|---|---|---|
| EP | 0 963 146 A1 | 12/1999 |
| JP | 02-58293 A | 2/1990 |
| JP | 2000-59080 A | 8/1998 |
| JP | 11-243296 A | 9/1999 |
| JP | 11-344933 A | 12/1999 |
| JP | 2000-59080 A | 2/2000 |
| JP | 2001-156489 A | 6/2001 |

OTHER PUBLICATIONS

European Search Report dated Apr. 3, 2008 issued in EP Application No. 02788599.5.

* cited by examiner

*Primary Examiner*—Brian K Talbot
(74) *Attorney, Agent, or Firm*—Sughrue Mion, PLLC

(57) ABSTRACT

To manufacture an electromagnetic-wave shielding and light transmitting plate having a conductive pattern of which line width is narrow and open area ratio is high, a negative pattern 2 composed of dots is printed on a transparent film 1 having a high affinity for a plated layer of a conductive material by using a transparent resin having a low affinity for the plated layer and a backside coating layer 3 is formed by printing a transparent resin on the entire back surface of the transparent film 1. Then, a conductive material layer is formed by electroless plating to cover the film exposed surface not covered by the negative pattern 2 of the film 1, thereby forming the conductive pattern 4. After that, the blackening treatment is conducted, thereby obtaining the electromagnetic-wave shielding and light transmitting plate.

9 Claims, 1 Drawing Sheet

ELECTROMAGNETIC-WAVE SHIELDING AND LIGHT TRANSMITTING PLATE AND MANUFACTURING METHOD THEREOF

CROSS REFERENCE TO RELATED APPLICATION

This is a continuation application of PCT/JP02/11544 filed on Nov. 6, 2002.

FIELD OF THE INVENTION

The present invention relates to an electromagnetic-wave shielding and light transmitting plate which can be suitably used as a front filter for a PDP (plasma display panel) or a window sheet (for example, a bonding film) for a building such as a hospital where needs electromagnetic-wave shielding and to a manufacturing method of the same. More particularly, the present invention relates to an electromagnetic-wave shielding and light transmitting plate which comprises a film and a conductive pattern formed on the film and to a manufacturing method of the same.

BACKGROUND OF THE INVENTION

Plates having electromagnetic-wave shielding property and light transmission properties have been developed as front filters of equipment such as office automation equipment and communication equipment in order to shield electromagnetic wave produced from such equipment. Such plates have been also utilized as window sheets of places where a precision apparatus is installed, such as a hospital and a laboratory, in order to protect the precision apparatus from electromagnetic waves for example from cellular phones.

A conventional electromagnetic-wave shielding and light transmitting plate typically comprises a pair of transparent substrates such as acrylic boards and a conductive mesh member like a wire netting or a transparent conductive film and is formed by interposing the conductive mesh member or the transparent conductive film between the transparent substrates and uniting them.

A conductive mesh member employed in the conventional electromagnetic-wave shielding and light transmitting plate is a 5- to 500-mesh member having a wire diameter of from 10 to 500 μm and an open area ratio (open area percentage) of less than 75%. The open area ratio is calculated from the wire diameter of mesh and the number of wires existing within a width of 1 inch. The electromagnetic-wave shielding and light transmitting plate employing such a conductive mesh member has low light transmittance of 70% at the most.

Moreover, such a conventional conductive mesh member easily allows the occurrence of moiré phenomenon due to relations between its patterns and the pixel pitch of a luminescent panel to which the electromagnetic-wave shielding and light transmitting plate is attached.

As means for satisfying the light transmitting property and the electromagnetic-wave shielding property simultaneously, it is considered to use a transparent conductive film instead of the conductive mesh member. In case of the transparent conductive film, however, it is difficult to achieve electric conduction relative to a panel body.

In case of the conductive mesh member, by designing the conductive mesh member to have margins out of the peripheries of the transparent substrate and folding the margins, the electric conduction between the folded margins and the panel body is achieved. If the transparent conductive film is designed to have margins out of the transparent substrate and the margins are folded, the film may be torn at the folded portions.

SUMMARY OF THE INVENTION

It is an object of the present invention to provide an electromagnetic-wave shielding and light transmitting plate having a conductive pattern of which line width is sufficiently narrow and open area ratio is significantly high and to provide a manufacturing method of the same.

A method of manufacturing an electromagnetic-wave shielding and light transmitting plate according to the present invention is a method for manufacturing an electromagnetic-wave shielding and light transmitting plate comprising a transparent film and a conductive pattern made of a conductive material, wherein the conductive pattern is formed on a surface of the transparent film by plating. The method comprises: a step of forming a negative pattern to be an opposite pattern of the conductive pattern, wherein the negative pattern is formed on the surface of the transparent film having a relatively high affinity for the plated layer by using a transparent resin having a relatively low affinity for the plated layer, and a step of forming the conductive pattern by subjecting the transparent film to plating treatment with plating solution after the formation of the negative pattern so as to attach the conductive material only to the surface of the transparent film not covered by the negative pattern.

Since the resin for forming the negative pattern has low viscosity, a fine and exquisite negative pattern can be formed. The conductive pattern formed on area not covered by the negative pattern has a significantly narrow line width and thus has a significantly large open area ratio.

According to the method of the present invention, for example, an electromagnetic-wave shielding and light transmitting plate having a conductive pattern of which line width is 200 μm or less and open area ratio is 75% or more can be manufactured.

The present invention provides an electromagnetic-wave shielding and light transmitting plate in which surfaces of portions of the transparent film at the apertures of the conductive pattern are covered by transparent resin. This electromagnetic-wave shielding and light transmitting plate has excellent surface flatness as compared to an electromagnetic-wave shielding and light transmitting plate of a type in which surfaces of portions of a transparent film at the apertures of a conductive pattern are not covered by transparent resin. The electromagnetic-wave shielding and light transmitting plate having excellent surface flatness is advantageous when another film such as an antireflection film is attached to it or when a protective coating is applied to it.

DETAILED DESCRIPTION

Figure 1:
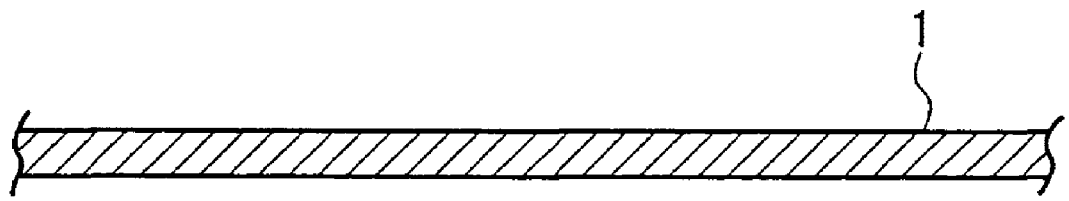
FIGS. 1, 2, and 3 are sectional views showing an embodiment of the method according to the present invention.
Figure 2:
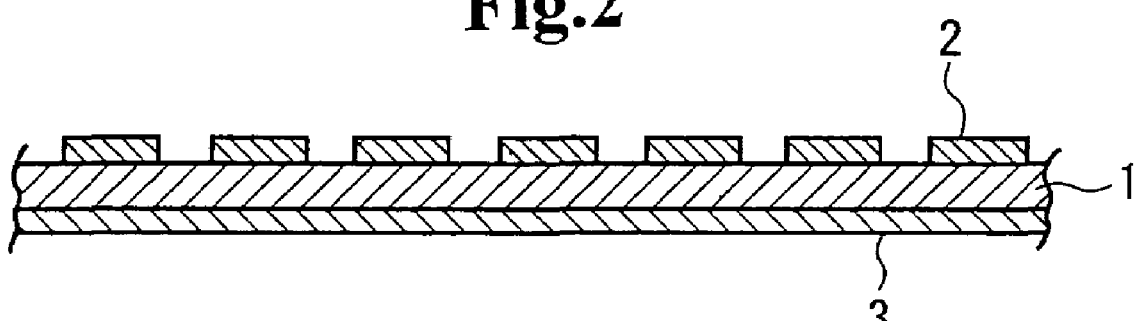

In an embodiment of the present invention shown in FIGS. 1 and 2, a negative pattern 2 composed of a plurality of dots is formed by printing with a transparent resin material having a relatively low affinity for a plated layer of a conductive material on a transparent film 1 and a backside coating layer 3 is formed by printing with the same transparent resin on the entire back surface of the transparent film 1. The pattern 2 and the layer 3 may be formed separately such that either of the pattern 2 and layer 3 is previously formed and may be formed simultaneously. Then, the transparent film 1 is subjected to plating treatment so as to form a conductive pattern 4 of a conductive material to coat the entire exposed surface which is not covered by the negative pattern 2 of the film 1 as shown in FIG. 3.

The conductive pattern 4 occupies areas not covered by the negative pattern 2 so as to have a mesh form as a whole.

Therefore, by setting the distance between adjacent dots of the negative pattern 2 to be narrower, the conductive pattern 4 having a mesh form of a narrower line width is obtained. By setting the line width to be narrower and designing the negative pattern 2 to have dots of larger area, the conductive pattern 4 having a mesh form of a larger open area ratio is obtained.

Figure 3:
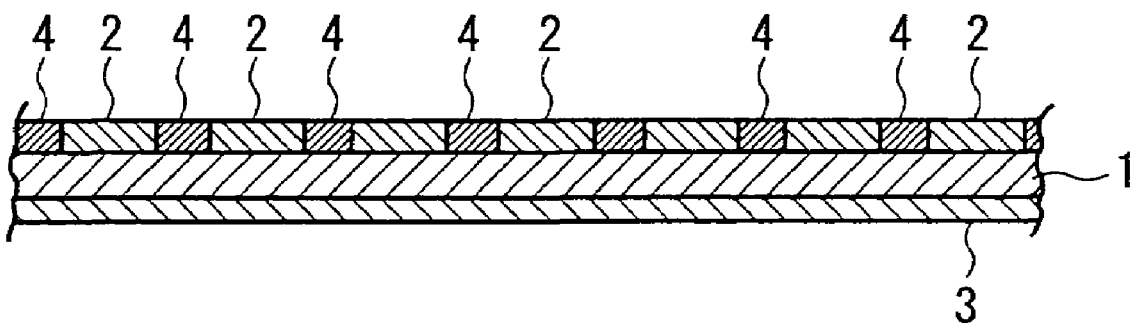

The backside coating layer 3 may be removed after the process shown in FIG. 3.

Hereinafter, preferred examples of the aforementioned respective materials will be described.

As the material of the transparent film 1, a transparent synthetic resin having a high affinity for the plated layer of the conductive material is employed. Examples of the synthetic resin include ABS, MBS (methyl methacrylate butadiene styrenecopolymer), triacetylcellulose, PET, PBT (polybutylene terephthalate), PEN (polyethylene naphthalate), PC (polycarbonate)/ABS alloy, and polypropylene, but not limited thereto.

As the transparent film, a transparent film made of material having a high affinity for the plated layer as its chemical property may be used and a transparent film which is subjected to acid treatment, alkali treatment, or the like to have a high affinity for the plated layer may be used. Further, a transparent film of which affinity for the plated layer will be intensified by contact with plating solution may be used.

The thickness of the transparent film depends on the application of the electromagnetic-wave shielding and light transmitting plate and usually is in a range of from 1 μm to 5 mm.

The negative pattern 2 on the film 1 is preferably formed by printing. Suitably used as the printing material are materials commercially-designated as photoresist. Among such materials, a photoresist mainly containing acrylic polymer is particularly suitable. When the negative pattern is printed with such a photoresist, the printed photoresist is hardened by irradiation of energy beam such as ultraviolet ray and is then subjected to plating treatment.

The negative pattern 2 is printed to be a form composed of dots such that the film exposed area not covered by the negative pattern 2 takes a mesh form. The negative pattern 2 is printed such that the line width of the film exposed area is preferably 200 μm or less, more preferably 100 μm or less, especially preferably 30 μm or less. As the printing method, gravure printing, screen printing, ink jet printing, or electrostatic printing can be suitably employed. In order to minimize the line width, the gravure printing is suitable.

The shape of dots may be any shape such as circular shape, elliptical shape, and rectangular shape. Rectangular shape, especially square shape, is preferable.

The printing thickness of the negative pattern is not particularly limited and usually is in a range of from 0.1 μm to 10 μm. The thickness of the negative pattern is preferably substantially equal to the thickness of the plated layer which will be formed later (from 70% to 130%, more preferably from 80% to 120% of the thickness of the plated layer).

In order to prevent the plated layer from being formed on the back of the transparent film, it is preferable to form the backside coating layer 3 with a material having a relatively low affinity for the plated layer. The material of the backside coating layer 3 is preferably the same as the material of the negative pattern 2, but may be different from the material of the negative pattern 2. The backside coating layer 3 may be removed after the plating. However, it is preferable not to remove the backside coating layer 3 for the purpose of reducing the number of steps of the manufacturing process.

Examples suitably used as the conductive material forming the conductive pattern 4 are metals of aluminum, nickel, indium, chromium, gold, vanadium, tin, cadmium, silver, platinum, copper, titanium, cobalt, and zinc and alloys thereof. Among these, pure metals of copper, nickel, chromium, zinc, tin, silver, and gold and alloys thereof are preferable.

The thickness of the pattern 4 of the conductive material is preferably from 0.1 μm to 10 μm. When the thickness is less than 0.1 μm, the electromagnetic-wave shielding property must be insufficient. When the thickness of the pattern 4 is larger than 10 μm, the view angle of the electromagnetic-wave shilding and light transmitting plate may be narrow.

As the method of forming the conductive pattern 4, liquid-phase plating, particularly electroless plating, is preferable.

Before the electroless plating, the transparent film 1 having the negative pattern 2 and the backside coating layer 3 may be subjected to pretreatment with acid. The pretreatment with acid increases the affinity for the plated layer of the area not covered by the negative pattern 2. Examples of the acid include chromic acid, sulfuric acid, and blend thereof.

After the formation of the pattern 4 of the conductive material, blackening treatment may be applied in order to impart antidazzle property. As the blackening method, oxidation treatment of metal or black plating treatment with chromium alloy may be employed.

The electromagnetic-wave shielding and light transmitting plate manufactured as mentioned above may be a piece of film or a continuous web-like film which is accommodated in a roll form.

EXAMPLES

Hereinafter, an example will be described. The example is just an illustrative example of the present invention and the present invention is not limited by the example.

Example 1

Dots were printed on a triacetylcellulose film of 100 μm in thickness by using 20% solution of plating resist (SM1798JR-1 available from Fujikura Kasei Co., Ltd.) mainly containing acrylic polymer. Each dot was a square shape of which one side was 234 μm and the space between adjacent dots was 20 μm. The dots were arranged in a square grid. The printing thickness after dried was about 2 μm. A backside coating layer was formed with the same plating resist on the entire back surface of the film in such a manner as to have a thickness after dried of 2 μm.

Copper was plated on the film exposed area not covered by the dots by means of the electroless plating in such a manner as to have an average thickness of 2 μm. Finally, blackening treatment was applied by means of oxidation treatment, thereby obtaining an electromagnetic-wave shielding and light transmitting plate. It should be noted that the copper is not attached to the plating resist at all.

The conductive layer on the surface of the film was formed in a square grid form corresponding to a positive pattern precisely opposite to the negative pattern so that the line width was 20 μm and the open area ratio was 80%. The surface was significantly flat.

As mentioned above, an electromagnetic-wave shielding and light transmitting plate having a conductive pattern of which line width is narrow and open area ratio is high can be manufactured.

What is claimed is:

1. A method of manufacturing an electromagnetic-wave shielding and light transmitting plate comprising a transparent film and a conductive pattern made of a conductive material, wherein the conductive pattern is formed on a surface of the transparent film by plating, the method comprising:
    a step of forming a negative pattern to be an opposite pattern of said conductive pattern, wherein the negative pattern is formed on the surface of the transparent film having a relatively high affinity for the plated layer by using a transparent resin having a relatively low affinity for the plated layer, and
    a step of forming said conductive pattern by subjecting the transparent film to plating treatment with plating solution after the formation of the negative pattern so as to attach the conductive material only to the surface of the transparent film not covered by the negative pattern,
    wherein said negative pattern is formed by means of printing.

2. A method of manufacturing an electromagnetic-wave shielding and light transmitting plate as claimed in claim 1, wherein after said conductive pattern is formed, said conductive pattern is subjected to blackening treatment.

3. A method of manufacturing an electromagnetic-wave shielding and light transmitting plate as claimed in claim 1, wherein said transparent film is made of one or more selected from a group consisting of ABM, MBS, triacetylcellulose, PET, PBT, PEN, PC/ABS alloy, and polypropylene.

4. A method of manufacturing an electromagnetic-wave shielding and light transmitting plate as claimed in claim 1, wherein said transparent resin is a resin mainly containing acrylic polymer.

5. A method of manufacturing an electromagnetic-wave shielding and light transmitting plate as claimed in claim 1, wherein said conductive material contains at least one of a group consisting of copper, nickel, chromium, zinc, tin, silver, and gold.

6. A method of manufacturing an electromagnetic-wave shielding and light transmitting plate as claimed in claim 1, wherein said negative pattern is composed of dots.

7. A method of manufacturing an electromagnetic-wave shielding and light transmitting plate as claimed in claim 1, wherein, after the negative pattern is formed, a line width of exposed transparent film is 200 µm or less.

8. A method of manufacturing an electromagnetic-wave shielding and light transmitting plate as claimed in claim 1, wherein the negative pattern is formed to a thickness in a range from 0.1 µm to 10 µm.

9. A method of manufacturing an electromagnetic-wave shielding and light transmitting plate as claimed in claim 1, wherein the negative pattern is formed to a thickness in a range from 70% to 130% of a thickness of the conductive pattern.

* * * * *